MEMORY CIRCUIT WITH IMPROVED WORD LINE NOISE PREVENTING CIRCUITS

BACKGROUND OF THE INVENTION

The present invention relates to a dynamic memory circuit employing field effect transistors, and more particularly to a word line noise preventing circuit for preventing a word line from being affected by noise or the like.

Dynamic memories have been widely utilized in various fields because of large memory capacity and relatively low power consumption. In dynamic memories, word lines are driven in a dynamic manner. Namely, all word lines are reset to the ground potential in reset (or precharge) periods and, in active periods, a selected one word line is driven to a power voltage (Vcc) through a source-follower transistor while the remaining non-selected word lines are left in a floating state. In other words, the non-selected lines are not connected to any voltage source in active periods. Therefore, the non-selected word lines are easily affected by noise such as voltage change in digit lines. Particularly, rise of potential of digit lines having higher level (logic 1 level) to the power voltage Vcc by active pull up circuits raise the potential of the non-selected word lines. In this case, many memory cells which should not be selected are erroneously accessed so that a plurality of stored data are simultaneously read out to the each digit line, resulting in destruction of memory data stored in the memory cells.

In order to avoid the above problem due to the fluctuation in the potentials of the non-selected word lines, word line noise preventing circuits are provided to the respective word lines. The word line noise preventing circuit maintains the potential of the non-selected word line at the ground potential during active periods.

On the other hand, half the digit lines which have been charged to a precharge voltage, such as the power voltage during a reset period, are discharged to the ground potential by amplifying operation of sense amplifiers.

The discharge of the digit lines affects a potential of a substrate on which a memory is fabricated and potentials of memory cell capacitors through coupling therebetween so that the potentials of the substrate and the memory cell capacitors are lowered.

Especially, in the memory cell storing logic "0" level, i.e. the ground potential, the potential of the memory cell capacitors is lowered from the ground potential to a negative potential, and in the case where such negative potential is lower than the ground potential which is applied to the non-selected word lines by a threshold voltage of memory cell transistors, the memory cell transistors having gates coupled to the non-selected word lines become conducting. Thus, in addition to the memory cell transistors coupled to the selected word line, the memory cell transistors coupled to the non-selected word lines are erroneously rendered conductive, which means in other words a plurality of data from a plurality of memory cells are read out on the same digit line at the same time. Accordingly, data stored in these memory cells are destroyed due to mutual interference.

SUMMARY OF THE INVENTION

It is an object of the present invention to provide a memory circuit which can operate stably without causing data destruction or malfunction.

The memory circuit according to the present invention is of the type having a plurality pairs of digit lines, a plurality of word lines intersecting with digit lines, a plurality of memory cells each coupled to one of the word lines and digit lines, a precharge circuit for precharging the digit lines to a predetermined potential in reset period, a word selection circuit for selectively applying a drive signal only to a selected word line, a plurality of sense amplifiers each coupled to each pair of digit lines for discharging the lower potential side digit line of the digit line pair without materially discharging the higher potential side digit line of the same digit line pair and a plurality of word line noise prevention circuits each coupled to each one of the word lines for clamping the non-selected word lines to a reference potential such as the ground potential, and is featured in that the word line noise prevention circuits are disenabled during a first period when the sense amplifiers discharge the lower potential side digit lines.

According to this feature, the word line noise prevention circuits are disabled during the amplifying period by the sense amplifiers so that the clamping of the non-selected word lines is released. Accordingly, the non-selected word lines are allowed to be affected by the discharge of the digit lines so that the potential of the non-selected word lines are lowered below the reference voltage as well as the fall of the potentials of the memory cell capacitors. Therefore, the gate-source potential of the memory cell transistors connected to the non-selected word lines is not increased, thereby preventing the memory cell transistors coupled to the non-selected word lines from assuming a conductive state during the period when the sense amplifiers discharge the digit lines. Thus, data destruction can be effectively avoided.

According to one aspect of the invention, the memory circuit is further provided with a plurality of active pull-up circuits each coupled to each pair of digit lines for operatively raising the higher potential side digit line to the power voltage after the amplification by the sense amplifier, and the word line noise preventing circuit is enabled at least during the period when the active pull-up circuit operates.

The word line noise preventing circuit according to the present invention is composed of a first field effect transistor having a current path connected between a first node and a reference potential source, a series circuit of second and third field effect transistors connected in series between one of the word lines and the reference potential source, the first and second transistors forming a flip-flop circuit, and a precharge transistor for operatively precharging the first node, the third transistor controlling the noise preventing circuit between the enabled state and the disabled state.

is larger than a threshold voltage of the memory cell transistor $Q_M$ in the memory cells storing "0" level, the memory cell transistor $Q_M$ is forward-biased to take a conductive state even though the word line connected thereto is of the non-selected (ground) level. Accordingly, a plurality of data stored in a plurality of memory cells are read out on to the same digit line in this case so that data of the memory cells are destroyed due to mutual interference among a plurality of memory cells.

The above fall in potentials of the substrate and the memory cell capacitors gradually recovers to return to their initial potentials due to a supply of charge to the substrate from the substrate bias circuit 10.

Subsequently, at a time $t_5$, the active pull-up circuits start their operations in response to a rise of a timing signal SE 2. Particularly, in the case where DL and $\overline{DL}$ are at "0" and "1" level, respectively, FET $Q_4$ is conducting and hence the potential at a node $N_3$ is discharged to the ground potential so that FET $Q_3$ becomes non-conductive state, while FET $Q_7$ is not conductive so that the rise of SE 2 is superposed on the previously charged level (Vcc) at a node $N_2$ so that the potential at the node $N_4$ rises above Vcc thereby to render FET $Q_8$ in the non-saturated conductive state. Accordingly, the potential of the higher potential digit line $\overline{DL}$ is raised to Vcc through FET $Q_8$.

As explained above, the discharge of the lower potential digit lines affects the memory cells, resulting in malfunction.

Figure 2:
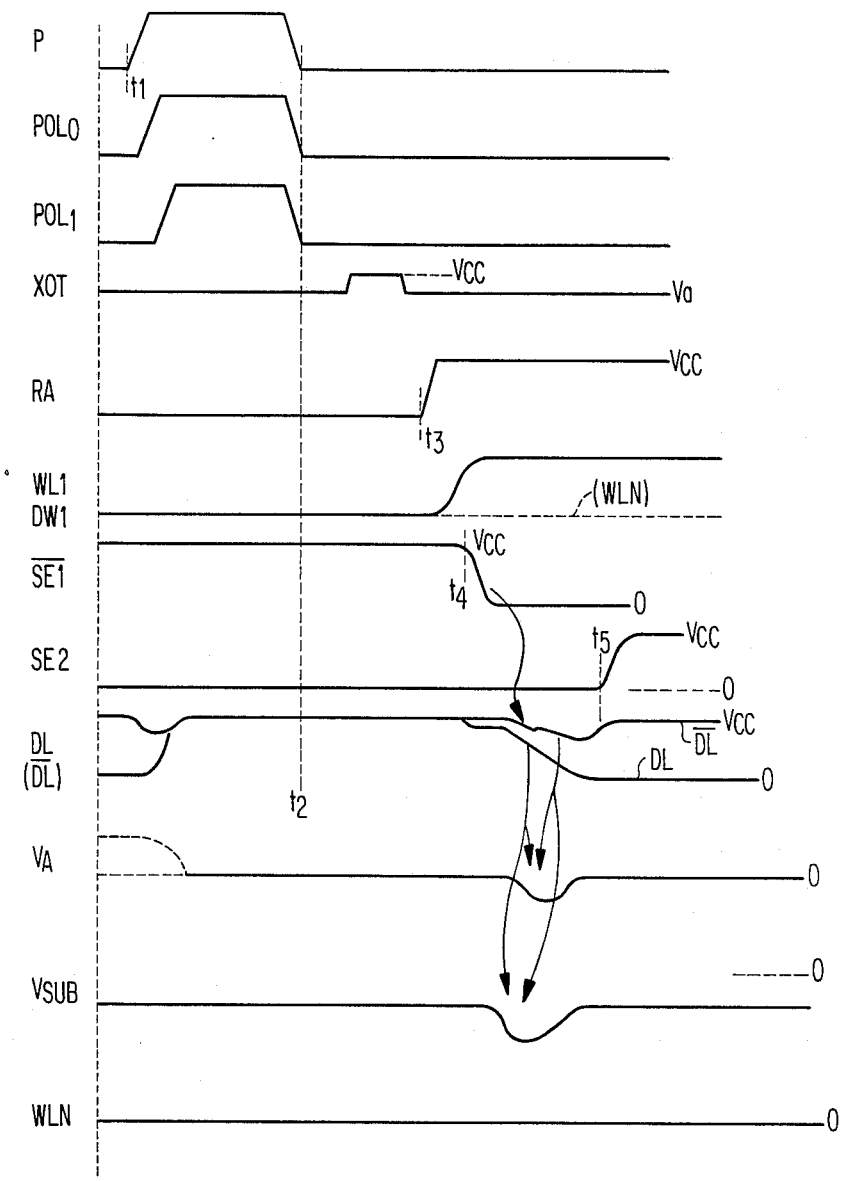
FIG. 2 is a timing chart showing operation of the memory circuit of FIG. 1.
Figure 3:
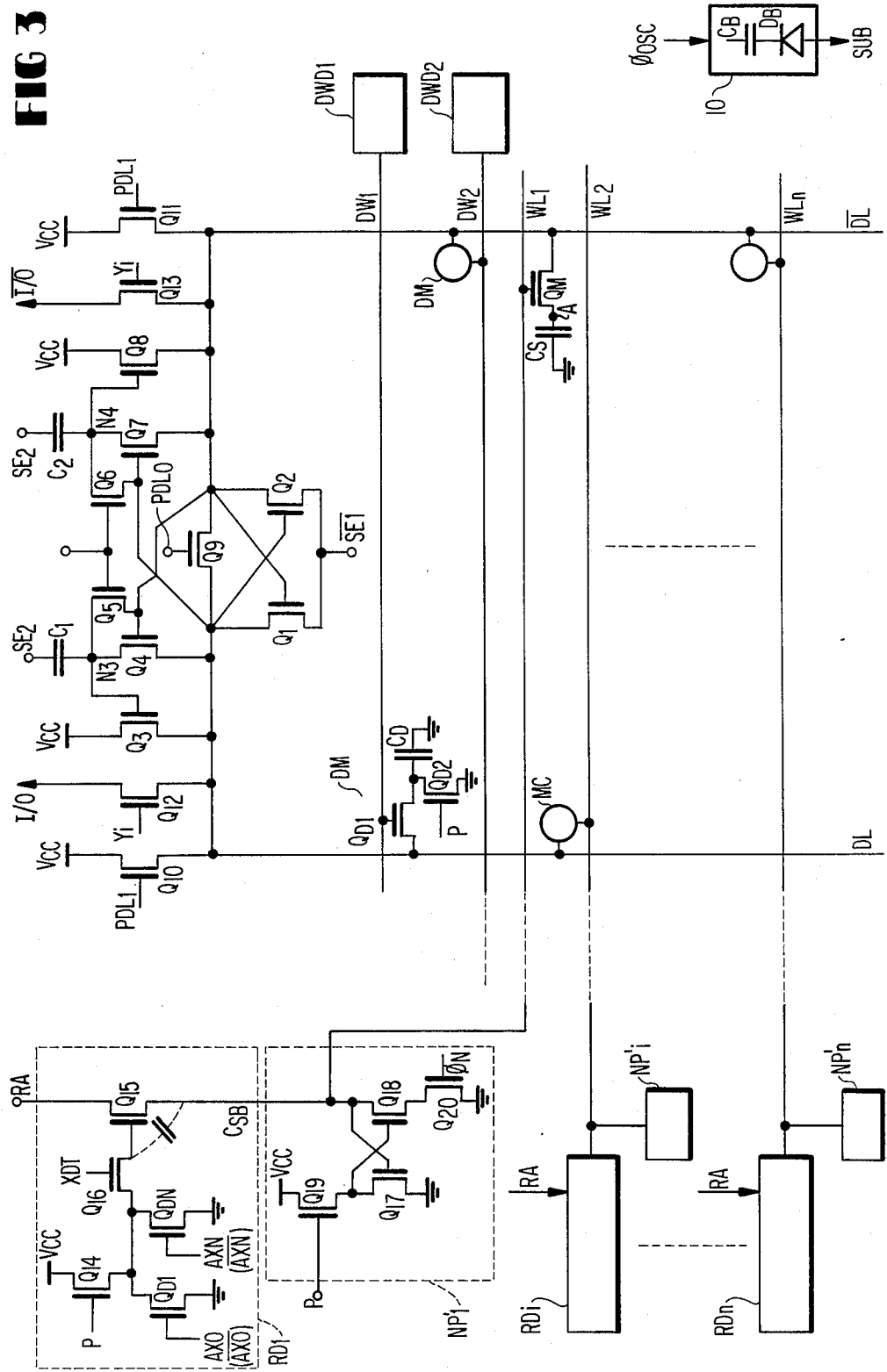
Figure 4:
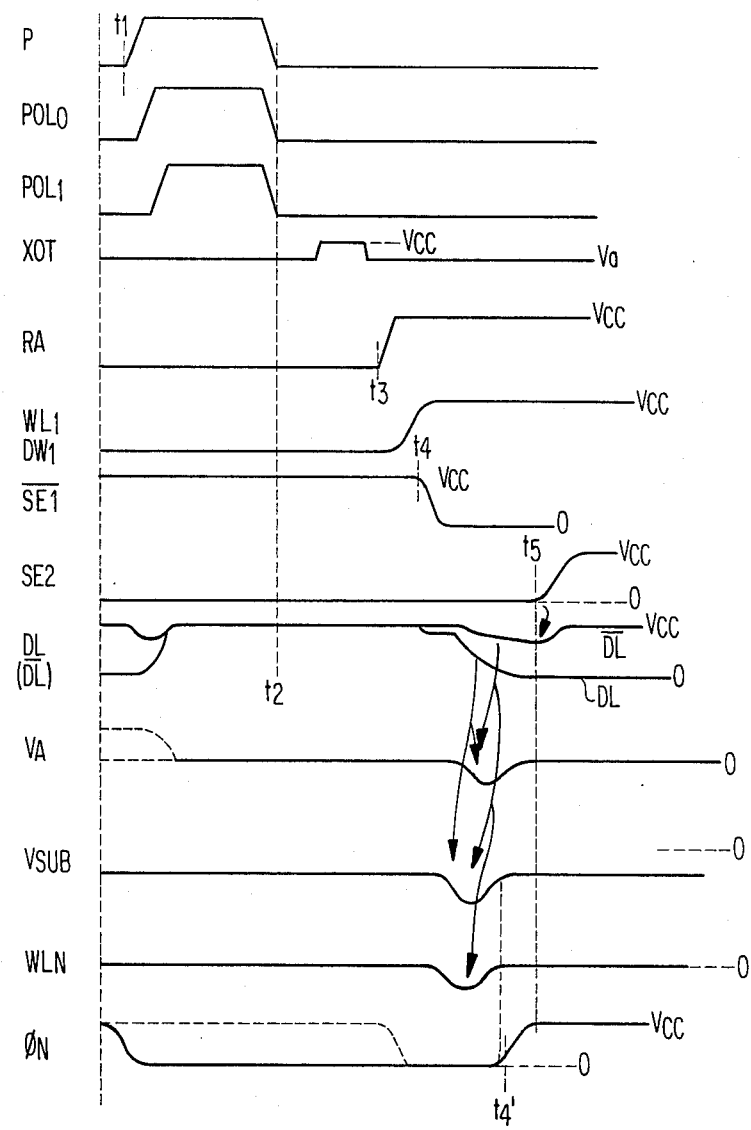

Referring to FIGS. 3 and 4, a memory circuit according to one embodiment of the invention is described. In FIGS. 3 and 4, elements corresponding to those in FIGS. 1 and 2 are designated by the same references.

Figure 1:
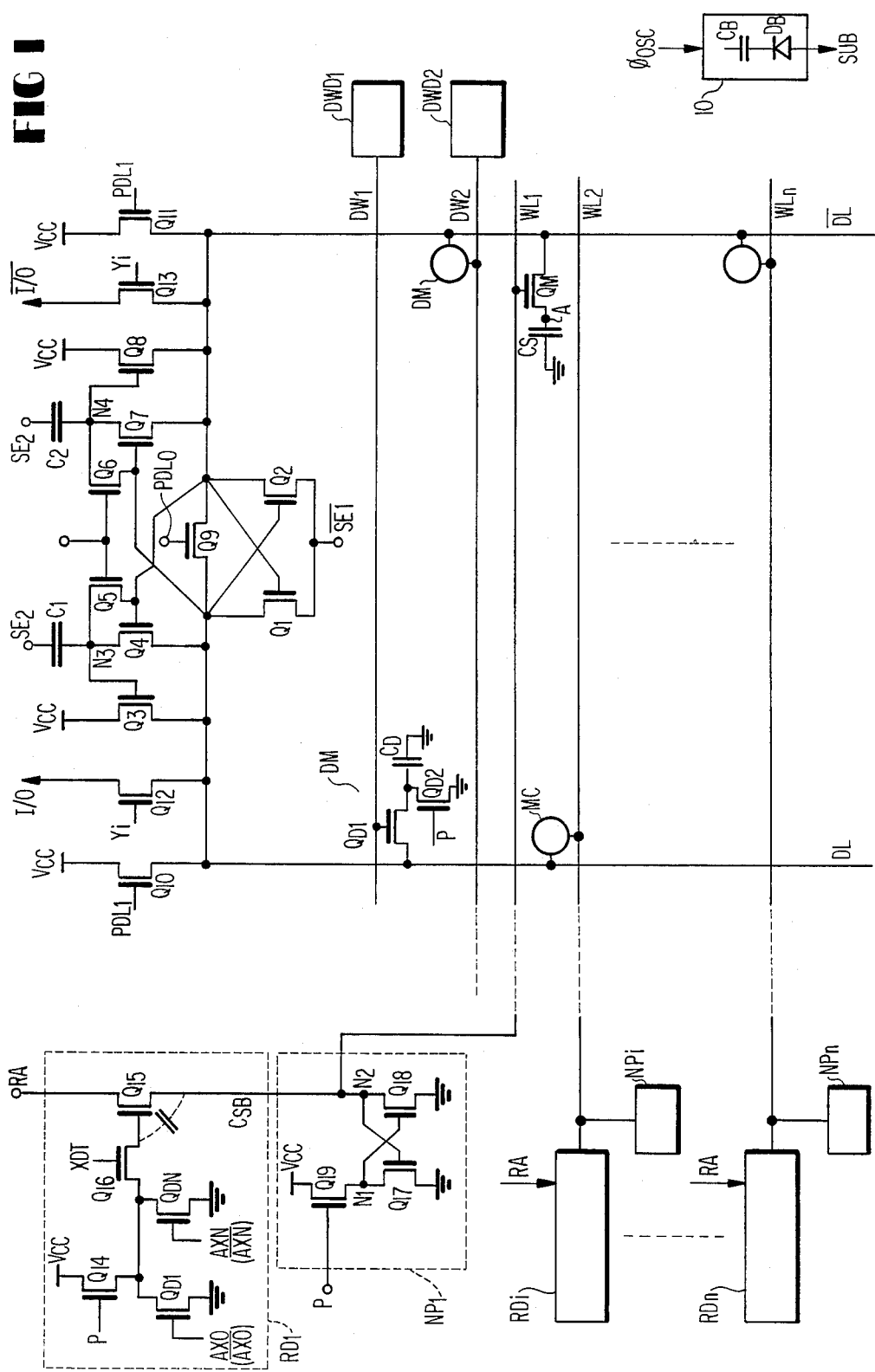
FIG. 1 is a schematic circuit diagram showing a major part of a memory circuit according to the prior art.

This embodiment is achieved by employing word line noise preventing circuits $NP_1'$ to $NP_n'$ in place of the circuits $NP_1$ to $NP_n$ in FIG. 1. The word line noise preventing circuit $NP_1'$ is composed of a series connection of FETs $Q_{18}$ and $Q_{20}$ connected between the word line $WL_1$ and the ground potential, FET $Q_{17}$ connected between the precharge node $N_1$ and the ground potential and forming a flip-flop with FET $Q_{17}$ and a precharge FET $Q_{19}$. A control signal $\phi_N$ is applied to a gate of FET $Q_{20}$. When the signal $\phi_N$ is high (Vcc) in level, EFT $Q_{20}$ is conductive thereby to enable the noise preventing circuit $NP_1'$. While $\phi_N$ is low (GND) in level, FET $Q_{20}$ is non-conductive thereby acting to disable the circuit $NP_1'$. The other noise preventing circuits $NP_2'$ to $NP_n'$ have the same construction as $NP_1'$.

The signal $\phi_N$ is rendered low in level when the sense amplifiers discharge the lower potential side digit lines so that the noise preventing circuits $NP_1'$ to $NP_n'$ are disabled. Accordingly, the non-selected word lines are not clamped to the ground potential but laid floating state. After discharge of the digit lines by the sense amplifiers and during the period when the active pull-up circuits are enabled thereby to raise the higher potential side digit lines approximately to Vcc, the signal $\phi_N$ is made high to enable the noise preventing circuits $NP_1'$ to $NP_n'$. Therefore, the non-selected word lines are clamped to the ground potential without being affected by the rise of the higher potential side digit lines by the active pull-up circuits.

The operation of this embodiment is explained with reference to FIG. 4.

The operation from the time point t1 to the time t4 is the same as that of the circuit of FIG. 1 except the noise preventing circuits. Namely, during this period from t1 to t4, the signal $\phi N$ assumes the low level (GND) to render FET Q20 non-conductive in each of the noise preventing circuits. Therefore, the noise preventing circuits NPi to NPn' are disabled so that the non-selected word lines are placed in a floating state. Subsequently, at a time t4, the signal SE1 has fallen from Vcc to the ground potential so that the sense amplifiers start their amplification operations, under the disabled state of the noise preventing circuits. Accordingly, the lower potential side digit lines are discharged. In response to the discharge of the digit lines, the substrate bias voltage VSUB and the potential VA of the memory cell capacitors Cs storing "0" level are lowered to negative values, respectively. However, in this instance the noise preventing circuits NPi to NPn' are disabled and therefore, the potential of the non-selected word lines are also lowered to a negative potential due to coupling between the substrate and the word lines.

Accordingly, even when the potential VA of the memory cell capacitor Cs is lowered to a negative value, the gate potential of the memory cell transistor QM coupled to the non-selected word line is simultaneously lowered to a negative value, as illustrated. Therefore, the memory cell transistor QM can be kept at non-conducting state. Accordingly, destruction of stored data and/or mutual interference among memory cells can be effectively avoided.

Subsequently, after the potential of the non-selected word line WLN, the substrate bias voltage VSUB and the potential VA of the memory cell capacitor CS return to their predetermined values at a time t4', the signal $\phi$N is raised to VCC thereby to enable the noise preventing circuits NPi to NPn'. Accordingly, the non-selected word lines are clamped to the ground potential. Then, at a time t5, the signal SE2 is raised to Vcc and the active pull-up circuits are enabled. Thus, the higher potential side digit lines are raised to Vcc by the pull-up circuit. The side of the higher potential side digit lines affect the non-selected word lines so as to raise their potentials. However, in this instance, the non-selected word lines are clamped to the ground potential by the noise preventing circuits, such affection can be effectively avoided.

As to the waveform of $\phi$N, it is also possible to maintain it at high during the period from t1 to t4 as illustrated by the dotted line in the Figure.

Figure 5:
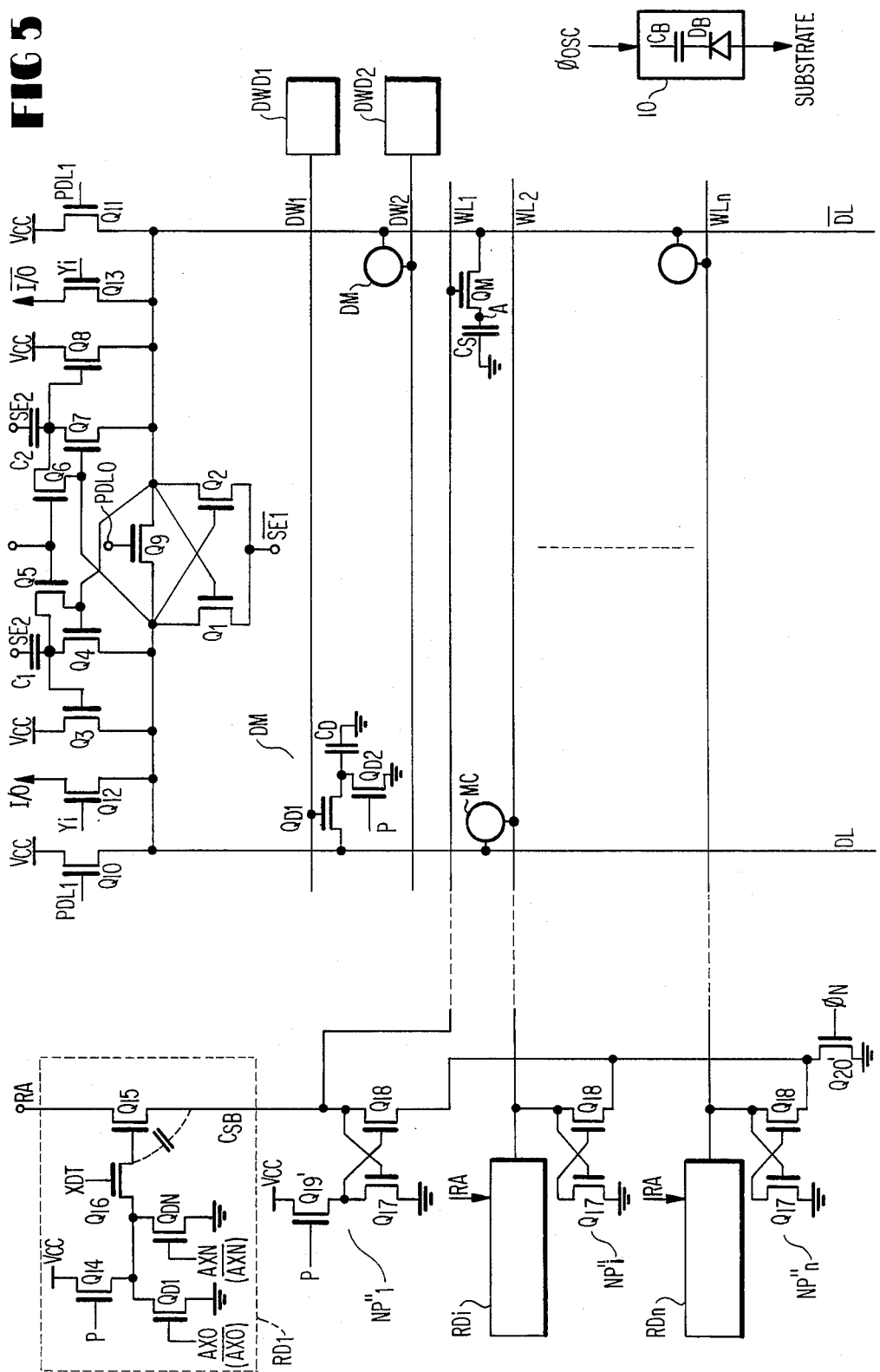

FIG. 5 shows another embodiment of the invention. This embodiment is featured in that FET Q20 receiving $\phi$N and the precharge FET Q19 in FIG. 3 are commonly provided as FETs Q20' and Q19' for a plurality of noise preventing circuits NP1" to NPn". According to this feature, the size of each noise preventing circuit can be reduced to enhance high density structure of a memory circuit.

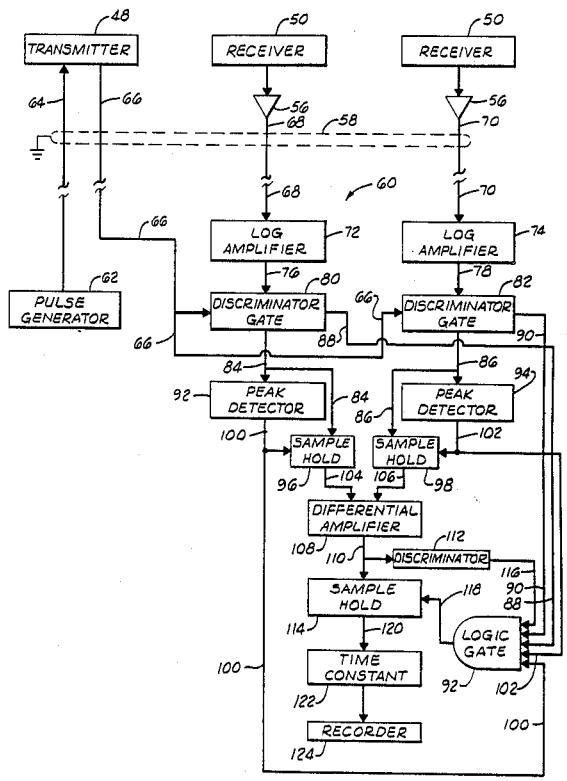

I claim:
1. A memory circuit comprising a pair of digit lines, a plurality of word lines intersecting with said pair of digit lines, a plurality of memory cells coupled to said digit lines and said word lines, a word line selection circuit for selecting one of said word lines, a sense amplifier provided for said pair of digit lines, said sense amplifier operatively discharging one of said pair of digit lines, a pull up circuit provided for said pair of digit lines, said pull up circuit operatively raising a potential of the other of said digit line to a power voltage after the discharge of said one of said digit lines, a plurality of word line noise preventing circuits each coupled to each one of said word lines, each of said noise preventing circuits operatively clamping the associated word line in the case where said associated word line is not selected, and control means for controlling said noise preventing circuits in such manner that said noise preventing circuits are disenabled when said sense amplifier discharges one of said digit lines and enabled when said pull up circuit raises a potential of the other of said digit lines.

2. The memory circuit according to claim 1, in which each of said memory cells is composed of a storage capacitor and a transistor having a gate coupled to one of said word lines and a source-drain path coupled between said storage capacitor and one of said digit lines.

3. The memory circuit according to claim 1, in which each of said noise preventing circuits includes a first transistor having a source-drain path coupled between a first node and a reference voltage source, a second transistor having a source-drain path coupled between one of said word lines and a second node, a gate of said first transistor being connected to said one of word lines, a gate of said second transistor being connected to said first node.

4. The memory circuit according to claim 3, in which said control means includes a switch coupled between said second node and said reference voltage source.

5. The memory circuit according to claim 1, further comprises a precharge circuit for operatively precharging said pair of digit lines to a predetermined potential.

6. A memory circuit comprising a pair of digit lines; a plurality of word lines intersecting with said digit lines; a sense amplifier coupled to said pair of digit lines; a word line selection circuit for selecting one of said word lines; a plurality of memory cells each coupled to one of said word lines and one of said digit lines; a plurality of noise preventing circuits each coupled to each one of said word lines; each of said noise preventing circuits including a first transistor having a current path coupled between a first node and a reference voltage terminal and having a gate coupled to a second node, and a second transistor having a current path coupled between said second node and a third node and having a gate coupled to said first node, said second node being connected to one of said word lines; a precharge circuit for operatively precharging said first node in each of said noise preventing circuit, and a switch circuit coupled between said reference voltage terminal and said third node in each of said noise preventing circuit.

7. A memory circuit comprising a pair of digit lines, a plurality of word lines intersecting with said pair of digit lines, a plurality of memory cells coupled to said digit lines and said word lines, a word line selection circuit for selecting one of said word lines, a sense amplifier provided for said pair of digit lines, said sense amplifier operatively discharging one of said pair of digit lines, a plurality of word line noise preventing circuits each coupled to each one of said word lines, each of said noise preventing circuits operatively clamping the associated word line in the case where said associated word line is not selected, and control means for controlling said noise preventing circuits in such manner that said noise preventing circuits are disenabled when said sense amplifier discharges one of said digit lines.

* * * * *

United States Patent [19]

Siebert

[11] Patent Number: 4,764,903

[45] Date of Patent: Aug. 16, 1988

[54] METHOD AND APPARATUS TO DETERMINE PERMEABILITY OF ROCK FORMATIONS ADJACENT A BOREHOLE

[75] Inventor: Robert M. Siebert, Ponca City, Okla.

[73] Assignee: Conoco Inc., Ponca City, Okla.

[21] Appl. No.: 594,194

[22] Filed: Mar. 28, 1984

[51] Int. Cl.$^4$ .............................................. G01V 1/00
[52] U.S. Cl. ...................................... 367/29; 367/30; 364/422; 181/105; 73/151
[58] Field of Search ....................... 367/25, 26, 28, 30, 367/31, 32, 29; 181/105; 364/422; 73/152

[56] References Cited

U.S. PATENT DOCUMENTS

| | | | |
|---|---|---|---|
| 3,376,950 | 4/1968 | Grine | 367/28 |
| 3,526,874 | 9/1970 | Schwartz | 367/30 |
| 3,949,352 | 4/1976 | Vogel | 367/31 |
| 3,962,674 | 6/1976 | Howell | 367/30 |
| 4,168,483 | 9/1979 | Parthasarathy et al. | 367/26 |
| 4,172,250 | 10/1979 | Guignard | 367/28 |
| 4,283,953 | 8/1981 | Plona | 367/86 |
| 4,346,460 | 8/1982 | Schuster | 367/27 |
| 4,432,077 | 2/1984 | Alhilali et al. | 367/31 |

OTHER PUBLICATIONS

Rosenbaum, "Synthetic Microseismograms: Logging in Porous Formations", Geophysics, vol. 39, No. 1 (Feb. 1974), pp. 14–32.

Primary Examiner—Thomas H. Tarcza
Assistant Examiner—Daniel T. Pihulic

[57] ABSTRACT

A method and apparatus for determination of earth formation permeability in situ. A logging sonde supported in a borehole derives attenuation data from at least two ultrasonic energy transmission paths which have a common alignment but differing length, the attenuation data can then be used to determine an empirical X parameter that is directly related to formation permeability.

4 Claims, 4 Drawing Sheets